United States Patent
Huang et al.

(10) Patent No.: US 6,956,519 B1
(45) Date of Patent: Oct. 18, 2005

(54) SWITCHED CAPACITOR CIRCUIT OF A PIPELINE ANALOG TO DIGITAL CONVERTER AND A METHOD FOR OPERATING THE SWITCHED CAPACITOR CIRCUIT

(75) Inventors: Jia-Jio Huang, Hsin-Chu (TW); Han-Chi Liu, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 2 days.

(21) Appl. No.: 10/711,877

(22) Filed: Oct. 11, 2004

(51) Int. Cl.[7] .......................... H03M 1/12; H03M 1/66
(52) U.S. Cl. ..................................... 341/172; 341/150
(58) Field of Search ................................ 341/172, 150, 341/122, 143, 155; 327/93, 554; 330/9; 333/173; 331/152

(56) References Cited

U.S. PATENT DOCUMENTS

| | | | |
|---|---|---|---|
| 4,543,534 A * | 9/1985 | Temes et al. ................... | 330/9 |
| 5,293,169 A * | 3/1994 | Baumgartner et al. ........ | 341/172 |
| 6,147,522 A * | 11/2000 | Rhode et al. .................. | 327/93 |
| 6,169,509 B1 * | 1/2001 | Abe ............................. | 341/150 |
| 6,307,497 B1 * | 10/2001 | Leung et al. ................. | 341/155 |
| 6,570,519 B1 * | 5/2003 | Yang ........................... | 341/143 |
| 6,621,444 B1 * | 9/2003 | Confalonieri et al. ....... | 341/172 |
| 6,683,514 B2 * | 1/2004 | Fujimoto ..................... | 333/173 |
| 6,778,009 B1 * | 8/2004 | Lee .............................. | 330/9 |
| 6,784,824 B1 * | 8/2004 | Quinn .......................... | 341/172 |
| 6,801,146 B2 * | 10/2004 | Kernahan et al. ............ | 341/122 |
| 6,853,241 B2 * | 2/2005 | Fujimoto ..................... | 330/9 |

* cited by examiner

Primary Examiner—Patrick Wamsley
(74) Attorney, Agent, or Firm—Winston Hsu

(57) ABSTRACT

A switched capacitor circuit of a pipeline analog to digital converter. The pipeline ADC includes a clock generator, a signal reference circuit, and a plurality of switched capacitor circuit. Each switched capacitor includes an operational amplifier, a first sampling capacitor, a first signal input switch, a first reference input switch, a first reference reset switch, and a first feedback network. A method for operating the switched capacitor circuit includes after the first reference input switch turning off, turning on the first signal input switch to transmit a first input signal to the first sampling capacitor and turning on the first reference reset switch to transmit a common signal to a second terminal of the first reference input switch, turning off the first reference rest switch then turning off the first signal input switch, and after the first signal input switch turning off, turning on the first reference input switch.

15 Claims, 6 Drawing Sheets

SWITCHED CAPACITOR CIRCUIT OF A PIPELINE ANALOG TO DIGITAL CONVERTER AND A METHOD FOR OPERATING THE SWITCHED CAPACITOR CIRCUIT

BACKGROUND OF INVENTION

1. Field of the Invention

The invention relates to a switched capacitor circuit, and more particularly, to a switched capacitor circuit of a pipeline analog to digital converter and related method.

2. Description of the Prior Art

A pipeline analog to digital converter (pipeline ADC) implemented by the technique of complementary metal oxide semiconductor (CMOS) is able to achieve a sampling rate of 100 M-samples/sec with low power consumption. In general, an analog to digital converter (ADC) utilizes switched capacitors for sampling and holding a signal, which means the pipeline ADC has to switch the capacitor rapidly in order to achieve the high sampling rate. In other words, the pipeline ADC is able to operate at a high sampling rate if the switched capacitor circuit of the pipeline ADC operates quickly.

In general, a switched capacitor circuit couples an input voltage to a capacitor periodically, and the capacitor, which is connected to an input terminal of an amplifier or other circuit, stores the electric charge corresponding to the input voltage periodically, then passes the input voltage to the next stage of the circuit. Please refer to FIG. 1, which is a schematic diagram of a prior art pipeline ADC 10. The pipeline ADC 10 includes a sample-and-hold amplifier (SHA) 12, a plurality of pipeline stages 14, 15, 16, 17, and a logic correction circuit 13. The pipeline ADC 10 converts an analog input signal $V_{IN}$ to a digital output signal $D_{OUT}$. The resolution of an analog to digital converter is defined by the number of bits of the digital output signal, which is referred to as N. As shown in FIG. 1 the pipeline ADC 10, which has four pipeline stages, is a four-bit analog to digital converter. The SHA 12 is the first stage of the pipeline ADC 10, and is used for sampling the analog input signal $V_{IN}$ and holding the sample voltage $V_{SH}$ as an input signal for the second stage of the pipeline ADC 10. The stage number of pipeline stage 14 following the SHA 12 is N−2, based on the definition of N above, of pipeline ADC 10. In the embodiment of FIG. 1, each pipeline stage outputs a 2-bit signal to the logic correction circuit 13. The bits $D_{11}$ and $D_{12}$, $D_{21}$ and $D_{22}$, $D_{31}$ and $D_{32}$, and $D_{41}$ and $D_{42}$ are output signals of the first pipeline stage 14, the second pipeline stage 15, the third pipeline stage 16, and the fourth pipeline stage 17 respectively.

Using the first pipeline stage 14 of the pipeline ADC 10 as an example, please refer to FIG. 2, which is a schematic diagram of the first pipeline stage 14 in FIG. 1. The first pipeline stage 14 includes a residue amplifier 26, a 1.5-bit analog to digital converter (ADC) 22, and a 1.5-bit DAC 24, wherein the 1.5-bit DAC 24 and the residue amplifier 26 combine to form a multiplying DAC (MDAC) 20. The ADC 22 converts the received analog voltage $V_{SH}$ to two bits $D_{11}$ and $D_{12}$, and passes the two bits $D_{11}$, $D_{12}$ to the 1.5-bit DAC 24 and the logic correction circuit 13 in FIG. 1. Next, the 1.5-bit DAC 24 converts the two bits $D_{11}$, $D_{12}$ to an analog signal $V_{DAC1}$ and passes the analog signal $V_{DAC1}$ to the signal amplifier 26. Finally, the signal amplifier 26 computes a residue signal $V_{res1}$ according to the difference of the output signal $V_{SH}$ of the last stage and the analog signal $V_{DAC1}$ received from the 1.5-bit DAC 24, and passes the residue signal $V_{res1}$ as the input signal of next stage. The other pipeline stages in FIG. 1 have the same function and structure as the first pipeline stage 14 detailed in FIG. 2.

Please refer to FIG. 3, which is a schematic diagram of the MDAC 20 in FIG. 2. As shown in FIG. 3, the input signals $V_{IN^+}$ and $V_{IN^-}$ are the differential signals of signal $V_{SH}$ in FIG. 1, signal $V_{DAC1^+}$ and $V_{DAC1^-}$ are the differential signals of output signal $V_{DAC1}$ of the 1.5-bit DAC 24, and signals $V_{res1^+}$ and $V_{res1^-}$ are both the differential signals of the output signal $V_{res1}$ of MDAC 20 and the output signals of the first pipeline stage 14 in FIG. 2. The MDAC 20 is a differential switched capacitor voltage doubler implemented by using a differential operational amplifier. The switches S1,...,S4,S5,...,S8 and S9, S10 are implemented by using transmission gate controlled by clock signals CLK21, CLK22, and CLK12 respectively. The other pipeline stages in FIG. 1 each have a corresponding MDAC with the same function and electrical structure.

Please refer to FIG. 4, which is a schematic diagram of the clock signal for the MDAC of FIG. 3. The clock signals CLK12, CLK21, CLK22 are generated by a clock generator (not shown), wherein the clock signal CLK21 is the inverse of the clock signal CLK22 with a little phase shift, and the clock signal CLK12 is an early-falling form of the clock signal CLK21. When the clock signal CLK21 is pulled up, the input signal $V_{IN^-}$ is sampled through the capacitor $C_S$, and during this period the operational amplifier is inactive. When the clock signal CLK22 is pulled up, the reference signal $V_{DAC^+}$ is coupled to the capacitors $C_S$, and $C_f$, wherein the electrical charge of capacitor $C_S$ is equal to the difference of the input signal $V_{IN}$ and the reference signal $V_{DAC1}$. Then the electrical charge is passed to the operational amplifier and a related output signal $V_{res1}$ is generated accordingly. In the worst case, the voltage range of the input signal $V_{IN}$ will be too large, as a result of the swing of the voltage of the input signal $V_{IN}$, when the procedure of sampling and holding occurs. This phenomenon may cause an overshooting of the output signal $V_{res1}$ of the operational amplifier and may reduce the performance of pipeline ADC 10.

In summary, a switched capacitor is usually used to implement the operation of sampling and holding in an ADC, such as the pipeline ADC 10, which includes a SHA 12, a plurality of pipeline stages 14,15,16,17, and a logic correction circuit 13. However, a large overshooting of the output signal can occur when the pipeline ADC samples and holds, if the input signals of each pipeline stage are swinging. Therefore, it is necessary to extend the operation time for switching capacitors, but this also necessarily reduces the efficiency of the pipeline ADC. This problem is the bottleneck to improving the efficiency of the typical pipeline ADC.

SUMMARY OF INVENTION

It is therefore one primary objective of the claimed invention to provide a switched capacitor circuit for a pipeline analog to digital converter and a method for operating the switched capacitor circuit so as to solve the aforementioned problem.

According to the claimed invention, a switched capacitor circuit is disclosed, the switched capacitor circuit comprises an operational amplifier having a first input terminal and a first output terminal, a first sampling capacitor having a first terminal connected to the first input terminal of the operational amplifier and a second terminal, a first signal input switch controlled by a first clock having a first terminal connected to the second terminal of the first sampling capacitor and a second terminal for inputting a first input signal, a first reference input switch controlled by a second clock having a first terminal connected to the second terminal of the first sampling capacitor and a second terminal for inputting a first reference signal, a first input reset switch controlled by a third clock having a first terminal connected to the first input terminal of the operational amplifier and a second terminal for inputting a common signal, a first reference reset switch controlled by a reset clock having a first terminal connected to the second terminal of the first reference input switch and a second terminal for inputting the common signal, and a first feedback network connected between the first input terminal of the operational amplifier and the first output terminal of the operational amplifier.

According to the claimed invention, an analog to digital converter is also disclosed. The analog to digital converter comprises a clock generator for generating a first clock, a second clock, a third clock, and a reset clock, wherein a phase of the first clock, a phase of the second clock, a phase of the third clock, and a phase of the reset clock are different, a reference signal circuit for generating a first reference signal, a second reference signal, and a common signal, and a plurality of switched capacitor circuits connected in series and connected between an analog input terminal and a digital output terminal, wherein each switched capacitor circuit comprises an operational amplifier having a first input terminal and a first output terminal, a first sampling capacitor having a first terminal connected to the first input terminal of the operational amplifier and a second terminal, a first signal input switch controlled by a first clock having a first terminal connected to the second terminal of the first sampling capacitor and a second terminal for inputting a first input signal, a first reference input switch controlled by a second clock having a first terminal connected to the second terminal of the first sampling capacitor and a second terminal for inputting the first reference signal, a first input reset switch controlled by the third clock having a first terminal connected to the first input terminal of the operational amplifier and a second terminal for inputting the common signal, a first reference reset switch controlled by the reset clock having a first terminal connected to the second terminal of the first reference input switch and a second terminal for inputting the common signal, and a first feedback network connected between the first input terminal and the first output terminal of the operational amplifier, wherein the first input terminal of each operational amplifier of the plurality of switched capacitor circuits connected in series is connected to the second terminal of the first signal input switch of the next switched capacitor circuit of the plurality of switched capacitor circuits connected in series, the second input terminal of each first signal input switch of a first of the plurality of switched capacitor circuits connected in series is connected to the analog input terminal, and the first output terminal of the operational amplifier of a last of the plurality of the switched capacitor circuits connected in series is connected to the digital output terminal.

According to the claimed invention, a method of operating a switched capacitor circuit is disclosed, wherein the switched capacitor circuit comprises an operational amplifier, a first sampling capacitor, a first signal input switch, a first reference input switch, a first reference reset switch, and a first feedback network. The method of operating a switched capacitor circuit comprises turning on the first signal input switch to transmit a first input signal to the first sampling capacitor, after turning off the first reference input switch, and turning on the first reference switch to transmit a common signal to a second terminal of the first reference input switch, turning off the first reference reset switch, and then turning off the first signal input switch, and turning on the first reference input switch, after turning off the first signal input switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
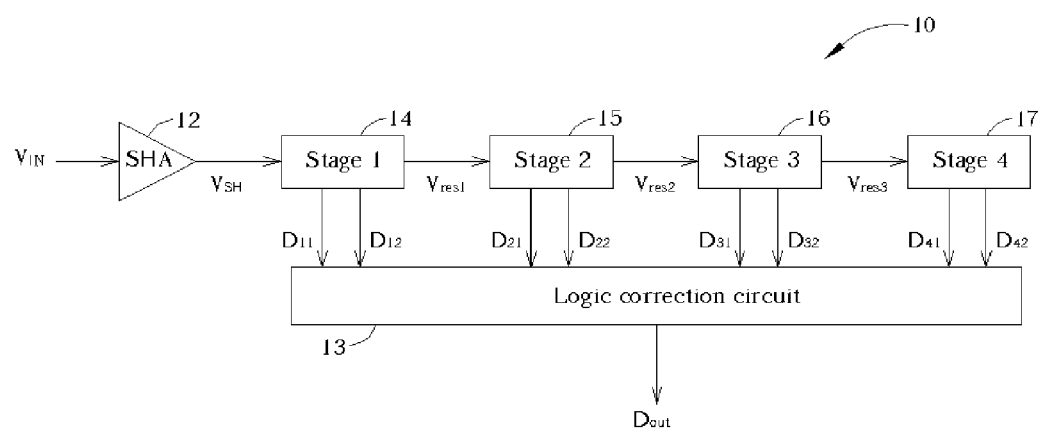
FIG. 1 is a schematic diagram of a prior art pipeline ADC.
Figure 2:
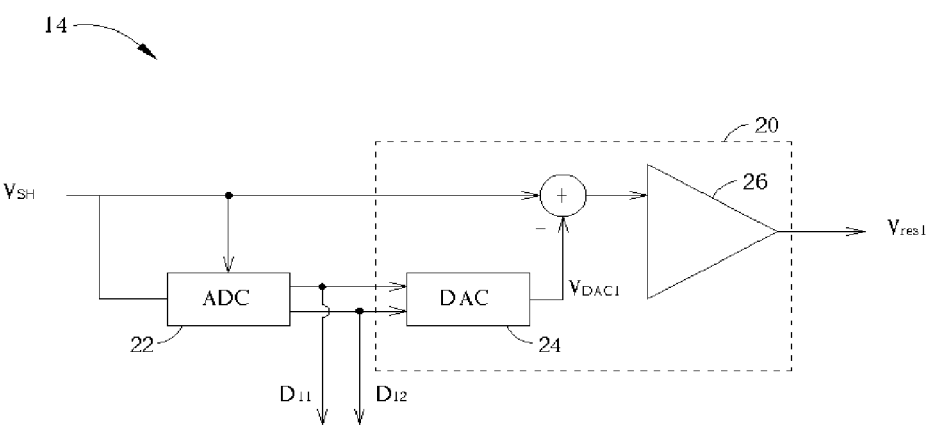
FIG. 2 is a schematic diagram of one stage of the prior art pipeline ADC stages shown in FIG. 1.
Figure 3:
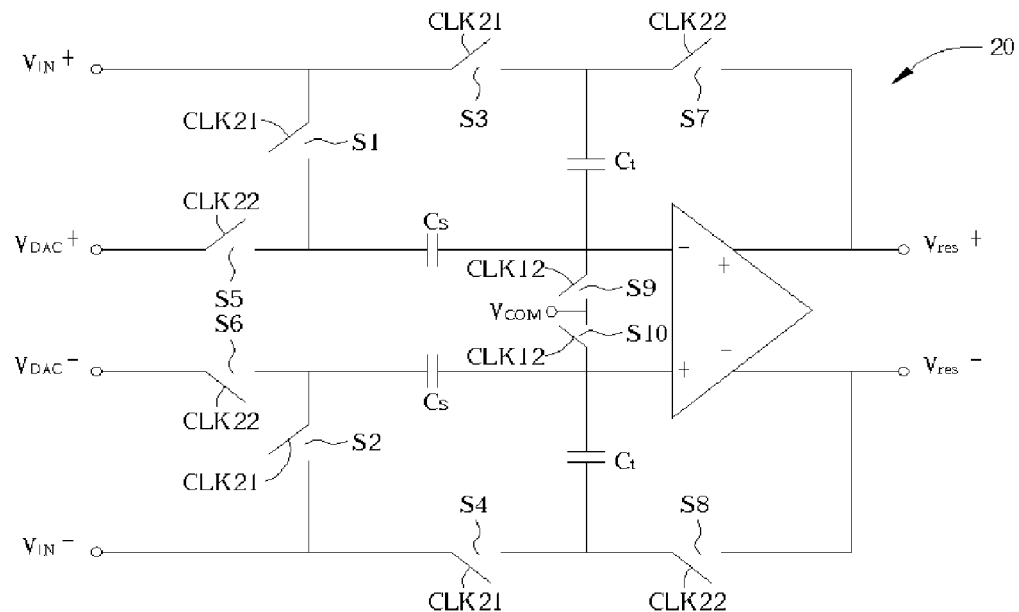
FIG. 3 is a schematic diagram of a prior art MDAC.
Figure 4:
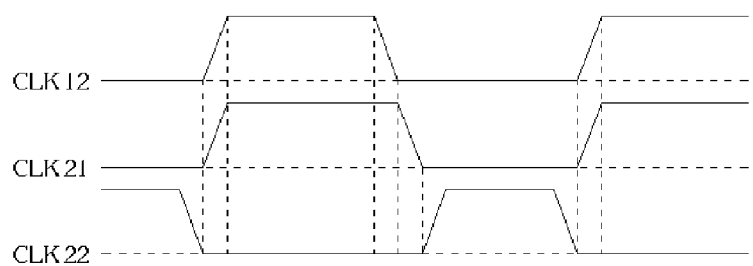
FIG. 4 is a schematic diagram of the clock signals of the prior art MDAC shown in FIG. 3.
Figure 5:
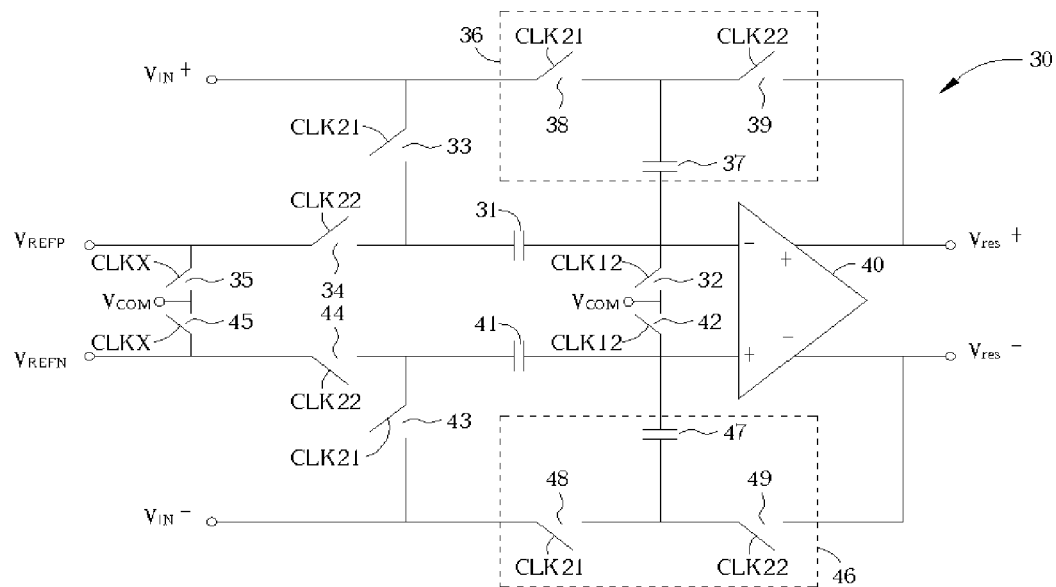
FIG. 5 is a schematic diagram of the switched capacitor circuit.
Figure 8:
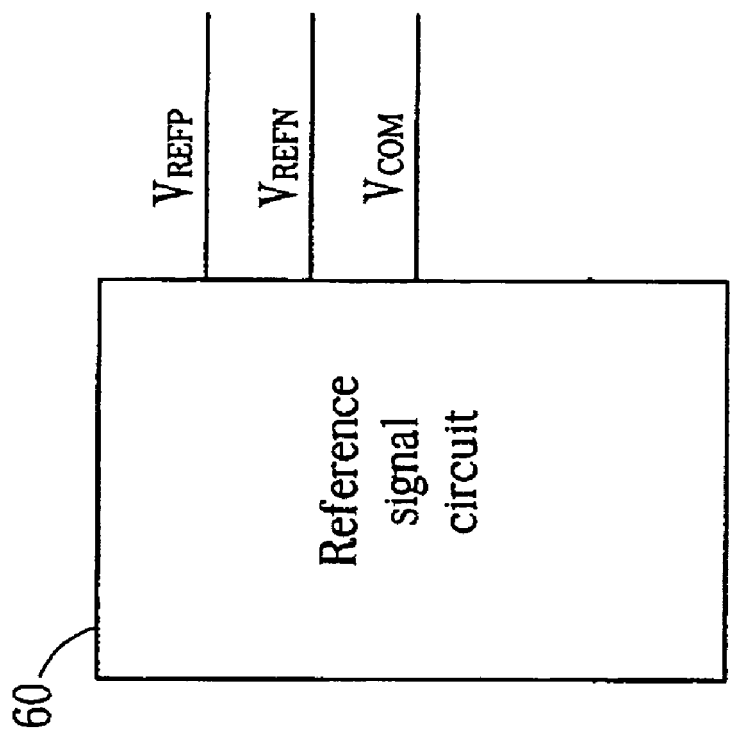
FIG. 8 is a diagram illustrating a reference signal circuit 60 producing reference signals.
Figure 9:
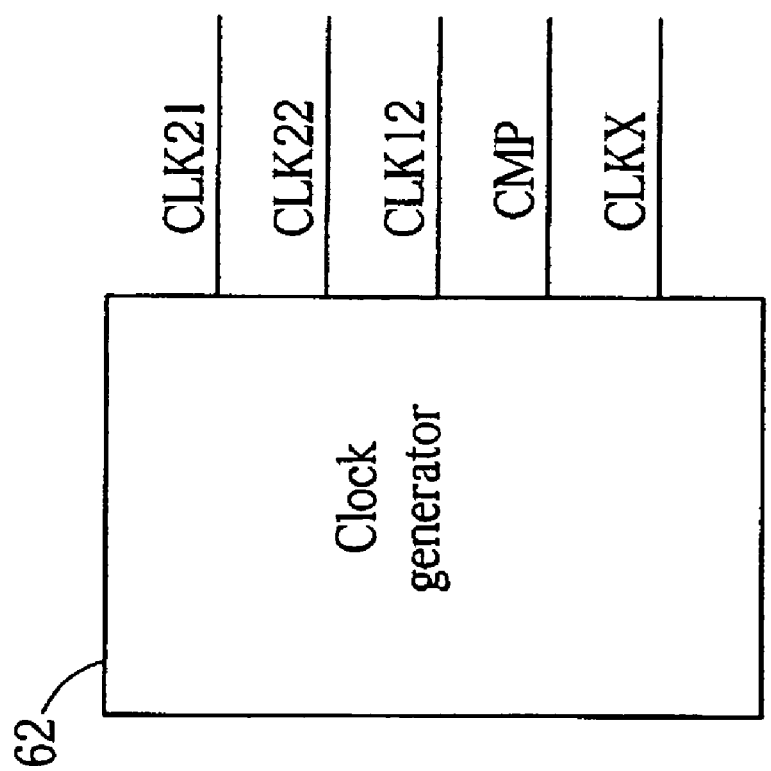
FIG. 9 is a diagram illustrating a clock generator 62 producing clock signals.

Please refer to FIG. 5, FIG. 8, and FIG. 9. FIG. 5 is a schematic diagram of the switched capacitor circuit 30 of the present invention. FIG. 8 is a diagram illustrating a reference signal circuit 60 producing reference signals. FIG. 9 is a diagram illustrating a clock generator 62 producing clock signals. As shown in FIG. 5, the switched capacitor circuit 30 includes an operational amplifier 40, two sampling capacitors 31, 41, two input reset switches 32, 42, two signal input switches 33, 43, two reference input switches 34, 44, two reference reset switches 35, 45, and two feedback networks 36, 46. The switched capacitor circuit 30 further comprises the reference signal circuit 60 for generating a reference signal $V_{REFP}$, a reference signal $V_{REFN}$, and a common signal $V_{COM}$, and the clock generator 62 for generating a first clock signal CLK21, a second clock signal CLK22, a third clock signal CLK12, and a clock signal CMP. On the upper side of the switched capacitor circuit 30, the first terminal of the sampling capacitor 31 is connected to the first input terminal of the operational amplifier 40, the first terminal of the input reset switch 32 is also connected to the first input terminal of the operational amplifier 40, the first terminal of the signal input switch 33 is connected to the second terminal of the sampling capacitor 31, the first terminal of the reference input switch 34 is also connected to the second terminal of the sampling capacitor 31, and the first terminal of the reference reset switch 35 is connected to the second terminal of the reference input switch 34. The input signal $V_{IN+}$ is inputted through the second terminal of signal input switch 33, the reference signal $V_{REFP}$ is inputted through the second terminal of reference input switch 34, and the common signal $V_{COM}$ is inputted through both the second terminal of the input reset switch 32 and the second terminal of the reference reset switch 35. The lower side of the switched capacitor circuit 30 has a similar electrical structure to the upper side.

The signal input switches 33 and 43 are controlled by the first clock CLK21, the reference input switches 34 and 44 are controlled by the second clock CLK22, and the input reset switches 32 and 42 are controlled by the third clock signal CLK12. Furthermore, the second clock signal CLK22 and the clock signal CMP are used to produce a reset clock signal CLKX through a NOR gate for controlling the reference reset switches 35 and 45. The first feedback network 36 is connected between the first input terminal of the operational amplifier 40 and the first output terminal of the operational amplifier 40. The second feedback network 46 is connected between the second input terminal of the operational amplifier 40 and the second output terminal of the operational amplifier 40, wherein the first and second feedback networks 36, 46 comprise a feedback capacitor 37/47, an input feedback switch 38/48, and an output feedback switch 39/49 respectively. The first terminal of the feedback capacitor 37 is connected to the first input terminal of the operational amplifier 40, the first terminal of the input feedback switch 38 is connected to the second terminal of the feedback capacitor 37, the first terminal of the output feedback switch 39 is also connected to the second terminal of the feedback capacitor 37, and the second terminal of the output feedback switch 39 is connected to the first output terminal of the operational amplifier 40. The input signal $V_{IN^+}$ is inputted through the second terminal of the input feedback switch 38, and the second feedback network 46 has a similar electrical structure to the first feedback network 36. Therefore, the difference between the capacitor switched circuit 30 of the present invention and the prior art circuit are the reference reset switches 35, 45 controlled by the reset clock signal CLKX, which are used to pull up the reference signal $V_{REF}$ to the level of the common signal $V_{COM}$ before changing state in order to reduce the overshooting of the corresponding output signal $V_{res}$ outputted by the operational amplifier 40.

Figure 6:
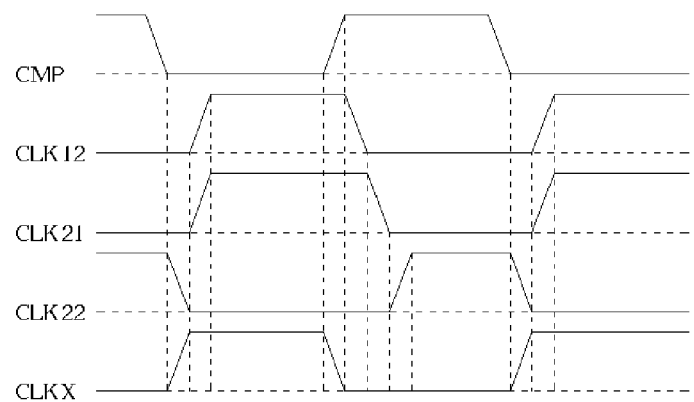
FIG. 6 is a schematic diagram of the clock signals of the switched capacitor circuit shown in FIG. 5.

Please refer to FIG. 6, which is the schematic diagram of the clock signal in FIG. 5. The first clock signal CLK21, the second clock signal CLK22, the third clock signal CLK12 and the clock signal CMP are generated by the clock generator 62, wherein the clock signal CLK21 is the opposite of CLK22 with a little phase shift, and the third clock signal CLK12 is an early-falling form of the first clock signal CLK21. The clock signal CMP is utilized by the pipeline ADC 10. When the first clock signal CLK21 is pulled up, the input signal $V_{IN}$ is sampled and transmitted to the sampling capacitors 31, 41, 37, 47, and the operational amplifier 40 is inactive at that moment. When the second clock signal CLK22 is pulled up, the reference signal $V_{REF}$ is also connected to the sampling capacitors 31, 41, so the electrical charge of the sampling capacitors 31, 41 is equal to the difference of the input signal $V_{IN}$ and the reference signal $V_{REF}$. Then the electrical charge is converted to a corresponding output signal $V_{res}$ through the operational amplifier 40. Referring to FIG. 6 and FIG. 5 at the same time, according to the clock signal in FIG. 6, the method of operating the capacitor switched circuit includes: (a) turning on the reference reset switches 35, 45 after the reference input switches 34, 44 are turned off in order to transmit the common signal $V_{COM}$ to the second terminals of reference input switches 34, 44, then turning on the signal input switches 33, 43 in order to transmit the input signal $V_{REFP}$ to the sampling capacitors 31, 41; (b) turning off the reference reset switches 35, 45, then turning off the signal input switches 33, 43; and (c) turning on the reference input switches 34, 44, after the signal input switches 33, 43 are turned off.

The reset clock signal CLKX changes to a high state. When the second clock signal CLK22 changes to a low state that means the switched capacitor circuit can decrease the difference between the input signal VIN and the reference signal $V_{REF}$ through turning on the reference reset switch 35, 45 in order to pull the reference signal $V_{REF}$ to the level of the common signal $V_{COM}$. This decreases the difference between the input signal VIN and the reference signal $V_{REF}$ and increases the spreading rate of the electrical charge in the sampling capacitors 31, 41 during a holding time. This has a better transformation performance when holding a signal for a long time after the signal is sampled, because when the reset clock signal CLKX is high, the reference input switches 34, 44 are turned off, so turning on the reference reset switches 35, 45 won't disturb the held signal, and the reset clock signal CLKX is pulled low before the second clock signal CLK21 is pulled low. In the worst case, when the voltage of the input signal $V_{IN}$ swings, the reference signal $V_{REF}$ is pulled high or low according to the common voltage (the median value) when the input signal $V_{IN}$ is sampled in order to reduce the overshooting of the output signal $V_{res}$ from the operational amplifier 40. Although it may worsen the situation to pull the reference signal $V_{REF}$ to the median value when the input signal $V_{IN}$ is stable, it improves the situation of the worst case and improves the performance of the whole switched capacitor circuit 30.

When utilizing the switched capacitor circuit 30 of the present invention shown in FIG. 5 in a pipeline ADC, the switched capacitor circuit 30 of the present invention is used as a pipeline stage, creating a pipeline ADC with a plurality of pipeline stages according to the structure of a typical pipeline ADC. The difference between a prior art pipeline ADC and the pipeline ADC of the present invention is the inner structure of each pipeline stage and the corresponding control clock signals. As mentioned above, the method of switching the capacitors and switched capacitor circuit 30 pulls the voltage to high or low according to the common voltage, when it samples and holds an input voltage, to reduce the overshooting of the output signal of the operational amplifier. Therefore, it also improves the efficiency of the whole pipeline ADC by reducing the overshooting of each pipeline stage.

Figure 7:
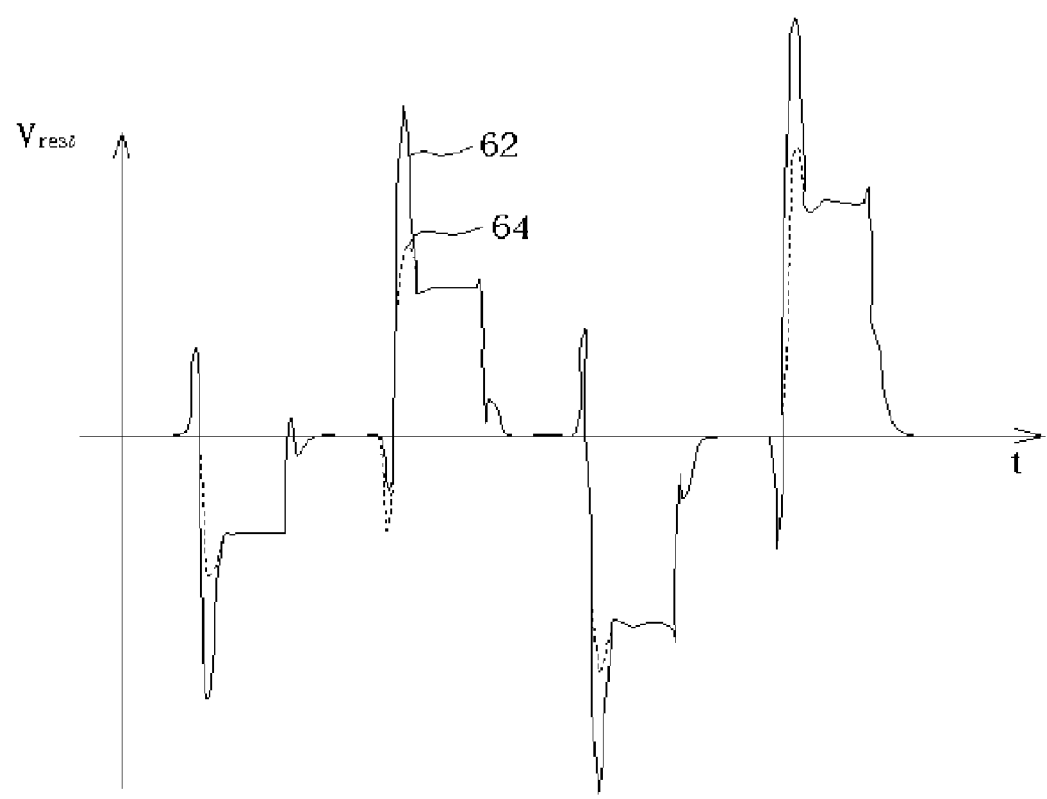
FIG. 7 is a schematic diagram of the simulated output signal of a typical switched capacitor circuit of the prior art compared to the simulated output signal of the switched capacitor circuit of the present invention.

Please refer to FIG. 7, which is a schematic diagram of the simulated output signal of the prior art switched capacitor circuit and the simulated output signal of the switched capacitor circuit of the present invention, wherein the simulated output signal of the typical switched capacitor circuit is drawn as a solid line, and the simulated output signal of the switched capacitor circuit of the present invention 30 is drawn as a dotted line. As shown in figure, the simulated output signal of the typical switched capacitor circuit shows overshooting when it changes state, because the difference of the reference signal and the input signal is amplified by the operational amplifier, worsening the phenomenon when the input signal swings. Comparing the simulated output signal of the typical switched capacitor circuit with the simulated output signal of the switched capacitor circuit of the present invention 30, the simulated output signal of the switched capacitor circuit of the present invention 30 has smaller overshooting, because the reference signal is forced to the median value then pulled high or low to reduce the overshooting.

In summary, the embodiment of the present invention provides improvements for both the switched capacitor circuits and the related operation method thereof. The switched capacitor circuit 30 of the present invention includes reference reset switches 35, 45 placed ahead of the reference input switch 34, 44, for pulling the reference signal $V_{REF}$ to the level of the common signal $V_{COM}$, when it is turning on during the sampling period. In this way, it reduces the difference of the reference signal $V_{REF}$ and the input signal $V_{IN}$, reduces the overshooting of the output signal $V_{res}$ of the operational amplifier 40, and decreases the settling time of each pipeline stage and of the whole pipeline ADC when utilizing the reference reset switches 35, 45. As for the pipeline ADC, each pipeline stage of the ADC also achieves a higher sampling frequency and better performance.

Compared with the prior art, the switched capacitor circuit of the present invention can reduce the overshooting of the output signal significantly, when the input signal swings. However, in the worst case, the prior art switched capacitor circuit pulls the output voltage from the top to the bottom or from the bottom to the top, causing a great overshooting when it samples and holds. Therefore, the present invention reduces the settling time and decreases the overshooting to pull the reference signal to the level of the common signal by using the reference reset switch placed ahead of the reference input switch of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switched capacitor circuit comprising:
    an operational amplifier having a first input terminal and a first output terminal;
    a first sampling capacitor having a first terminal and a second terminal, the first terminal being connected to the first input terminal of the operational amplifier;
    a first signal input switch controlled by a first clock having a first terminal and a second terminal, the first terminal being connected to the second terminal of the first sampling capacitor, the second terminal being used for receiving a first input signal;
    a first reference input switch controlled by a second clock having a first terminal and a second terminal, the first terminal being connected to the second terminal of the first sampling capacitor, the second terminal being used for receiving a first reference signal;
    a first input reset switch controlled by a third clock having a first terminal and a second terminal, the first terminal being connected to the first input terminal of the operational amplifier, the second terminal being used for receiving a common signal;
    a first reference reset switch controlled by a reset clock having a first terminal and a second terminal, the first terminal being connected to the second terminal of the first reference input switch, the second terminal being used for receiving the common signal, the first clock, the second clock, and the reset clock each being out of phase with each other; and
    a first feedback network connected between the first input terminal of the operational amplifier and the first output terminal of the operational amplifier.

2. The switched capacitor circuit of claim 1, wherein the operational amplifier further comprises a second input terminal and a second output terminal, the first input terminal and the second input terminal are a differential input pair of the operational amplifier, the first output terminal and the second output terminal are a differential output pair of the operational amplifier, and the switched capacitor circuit further comprises:
    a second sampling capacitor having a first terminal and a second terminal, the first terminal being connected to the first input terminal of the operational amplifier;
    a second signal input switch controlled by the first clock having a first terminal and a second terminal, the first terminal being connected to the second terminal of the first sampling capacitor, the second terminal being used for receiving a second input signal;
    a second reference input switch controlled by the second clock having a first terminal and a second terminal, the first terminal being connected to the second terminal of the first sampling capacitor, the second terminal being used for receiving a second reference signal;
    a second input reset switch controlled by the third clock having a first terminal connected to the first input terminal of the operational amplifier and a second terminal for inputting the common signal;
    a second reference reset switch controlled by the reset clock having a fist terminal and a second terminal, the first terminal being connected to the second terminal of the first reference input switch, the second terminal being used for receiving the common signal; and
    a second feedback network connected between the second input terminal and second output terminal of the operational amplifier.

3. The switched capacitor circuit of claim 2, further comprising:
    a reference signal circuit for generating the first reference signal, the second reference signal, and the common signal.

4. The switched capacitor circuit of claim 2, wherein the second feedback network comprises:
    a second feedback capacitor having a first terminal and a second terminal, the first terminal being connected to the second input terminal of the operational amplifier;
    a second input feedback switch controlled by the first clock having a first terminal and a second terminal, the first terminal being connected to the second terminal of the second feedback capacitor, the second terminal being used for receiving the second input signal; and
    a second output feedback switch controlled by the first clock having a first terminal and a second terminal, the first terminal being connected to the second terminal of the second feedback capacitor, the second terminal being connected to the second output terminal of the operational amplifier.

5. The switched capacitor circuit of claim 1, further comprising:
    a reference signal circuit for generating the first reference signal and the common signal.

6. The switched capacitor circuit of claim 1, further comprising:
    a clock generator for generating the first clock, the second clock, the third clock, and the reset clock, wherein a phase change of the first clock, a phase change of the second clock, and a phase change of the reset clock do not occur at the same time.

7. The switched capacitor circuit of claim 1, wherein the first feedback network comprises:
   a first feedback capacitor having a first terminal and a second terminal, the first terminal being connected to the first input terminal of the operational amplifier;
   a first input feedback switch controlled by the first clock having a first terminal and a second terminal, the first terminal being connected to the second terminal of the first feedback capacitor, the second terminal being used for receiving the first input signal; and
   a first output feedback switch controlled by the first clock having a first terminal and a second terminal, the first terminal being connected to the second terminal of the first feedback capacitor, the second terminal being connected to the first output terminal of the operational amplifier.

8. An analog to digital converter comprising:
   a clock generator for generating a first clock, a second clock, a third clock, and a reset clock, wherein the first clock, the second clock, and the reset clock are each out of phase with each other;
   a reference signal circuit for generating a first reference signal, a second reference signal, and a common signal; and
   a plurality of switched capacitor circuits connected in series and connected between an analog input terminal and a digital output terminal, each of the switched capacitor circuits comprising:
      an operational amplifier having a first input terminal and a first output terminal;
      a first sampling capacitor having a first terminal and a second terminal, the first terminal being connected to the first input terminal of the operational amplifier;
      a first signal input switch controlled by a first clock having a first terminal and a second terminal, the first terminal being connected to the second terminal of the first sampling capacitor, the second terminal being used for receiving a first input signal;
      a first reference input switch controlled by a second clock having a first terminal and a second terminal, the first terminal being connected to the second terminal of the first sampling capacitor, the second terminal being used for receiving a first reference signal;
      a first input reset switch controlled by a third clock having a first terminal and a second terminal, the first terminal being connected to the first input terminal of the operational amplifier, the second terminal being used for receiving a common signal;
      a first reference reset switch controlled by a reset clock having a first terminal and a second terminal, the first terminal being connected to the second terminal of the first reference input switch, the second terminal being used for receiving the common signal; and
      a first feedback network connected between the first input terminal and the first output terminal of the operational amplifier,
   wherein a first input terminal of an operational amplifier within each of the switched capacitor circuits connected in series is connected to a second terminal of a first signal input switch of a next switched capacitor circuit of the switched capacitor circuits connected in series, a second input terminal of a first signal input switch within a first of the switched capacitor circuits connected in series is connected to the analog input terminal, and a first output terminal of an operational amplifier within a last of the switched capacitor circuits connected in series is connected to the digital output terminal.

9. The analog to digital converter of claim 8, wherein the operational amplifier of each of the switched capacitor circuits further comprises a second input terminal and a second output terminal, the first input terminal of the operational amplifier and the second input terminal of the operational amplifier are a differential input pair of the operational amplifier, the first output terminal of the operational amplifier and second output terminal of the operational amplifier are a differential output pair, and each of the switched capacitor circuits further comprises:
   a second sampling capacitor having a first terminal and a second terminal, the first terminal being connected to the first input terminal of the operational amplifier;
   a second signal input switch controlled by the first clock having a first terminal and a second terminal, the first terminal being connected to the second terminal of the first sampling capacitor, the second terminal being used for receiving a second input signal;
   a second reference input switch controlled by the second clock having a first terminal and a second terminal, the first terminal being connected to the second terminal of the first sampling capacitor, the second terminal being used for receiving a second reference signal;
   a second input reset switch controlled by the third clock having a first terminal and a second terminal, the first terminal being connected to the first input terminal of the operational amplifier, the second terminal being used for receiving the common signal;
   a second reference reset switch controlled by the reset clock having a first terminal and a second terminal, the first terminal being connected to the second terminal of the first reference input switch, the second terminal being used for receiving the common signal; and
   a second feedback network connected between the second input terminal of the operational amplifier and second output terminal of the operational amplifier.

10. The analog to digital converter of claim 9, wherein the second feedback network comprises:
   a second feedback capacitor having a first terminal and a second terminal, the first terminal being connected to the second input terminal of the operational amplifier;
   a second input feedback switch controlled by the first clock having a first terminal and a second terminal, the first terminal being connected to the second terminal of the second feedback capacitor, the second terminal being used for receiving the second input signal; and
   a second output feedback switch controlled by the first clock having a first terminal and a second terminal, the first terminal being connected to the second terminal of the second feedback capacitor, the second terminal being connected to the second output terminal of the operational amplifier.

11. The analog to digital converter of claim 8, wherein the first feedback network comprises:
   a first feedback capacitor having a first terminal and a second terminal, the first terminal being connected to the first input terminal of the operational amplifier;
   a first input feedback switch controlled by the first clock having a first terminal and a second terminal, the first terminal being connected to the second terminal of the first feedback capacitor, the second terminal being used for receiving the first input signal; and
   a first output feedback switch controlled by the first clock having a first terminal and a second terminal, the first terminal being connected to the second terminal of the first feedback capacitor, the second terminal being connected to the first output terminal of the operational amplifier.

12. A method of operating a switched capacitor circuit, the switched capacitor circuit comprising an operational amplifier, a first sampling capacitor, a first signal input switch, a first reference input switch, a first reference reset switch, and a first feedback network, the method comprising:

after turning off the first reference input switch, turning on the first signal input switch to transmit a first input signal to the first sampling capacitor and turning on the first reference reset switch to transmit a common signal to a second terminal of the first reference input switch;

turning off the first reference reset switch, and then turning off the first signal input switch; and turning on the first reference input switch after turning off the first signal input switch.

13. The method of claim 12, wherein the operational amplifier further comprises a second input terminal and a second output terminal, the first input terminal of the operational amplifier and the second input terminal of the operational amplifier are a differential input pair of the operational amplifier, the first output terminal of the operational amplifier and the second output terminal of the operational amplifier are a differential output pair of the operational amplifier, the switched capacitor circuit further comprises a second sampling capacitor, a second signal input switch, a second reference input switch, a second reference reset switch and a second feedback network, and the method further comprises:

turning on the second signal input switch when turning on the first signal input switch;

turning on the second reference input switch when turning on the first reference input switch; and turning on the second reference reset switch when turning on the first reference reset switch.

14. The method of claim 13, wherein the second feedback network comprises a second feedback capacitor, a second input feedback switch, and a second output feedback switch, and the method further comprises:

turning on the second input feedback switch when turning on the first signal input switch; and turning on the second output feedback switch when turning on the first reference input switch.

15. The method of claim 12, wherein the first feedback network comprises a first feedback capacitor, a first input feedback switch, and a first output feedback switch, the method further comprising:

turning on the first input feedback switch when turning on the first signal input switch; and turning on the first reference input switch when turning on the first output feedback switch.

\* \* \* \* \*